United States Patent
Schweiker et al.

(10) Patent No.: US 12,467,938 B2
(45) Date of Patent: Nov. 11, 2025

(54) SYSTEMS AND DEVICES FOR WHEEL SENSORS

(71) Applicant: Infineon Technologies AG, Neubiberg (DE)

(72) Inventors: Wolfgang Schweiker, Weyarn (DE); Simone Fontanesi, Villach (AT); Simon Hainz, Villach (AT); Manfred Schindler, Regensburg (DE); Michael Weber, Mainburg (DE)

(73) Assignee: Infineon Technologies AG, Neubiberg (DE)

( * ) Notice: Subject to any disclaimer, the term of this patent is extended or adjusted under 35 U.S.C. 154(b) by 288 days.

(21) Appl. No.: 17/880,020

(22) Filed: Aug. 3, 2022

(65) Prior Publication Data

US 2023/0041154 A1   Feb. 9, 2023

(30) Foreign Application Priority Data

Aug. 5, 2021 (DE) .......................... 102021120398.8

(51) Int. Cl.
| | |
|---|---|
| *G01P 3/481* | (2006.01) |
| *G01P 1/02* | (2006.01) |
| *G01P 3/487* | (2006.01) |
| *H01L 23/00* | (2006.01) |
| *H01L 23/31* | (2006.01) |
| *H01L 23/49* | (2006.01) |
| *H01L 23/495* | (2006.01) |

(52) U.S. Cl.
CPC ............. *G01P 3/481* (2013.01); *G01P 1/026* (2013.01); *G01P 3/487* (2013.01); *H01L 23/3107* (2013.01); *H01L 23/49* (2013.01); *H01L 23/495* (2013.01); *H01L 23/562* (2013.01)

(58) Field of Classification Search
CPC .......... G01P 3/481; G01P 1/026; G01P 3/487; H01L 23/3107; H01L 23/49; H01L 23/495; H01L 23/562
See application file for complete search history.

(56) References Cited

U.S. PATENT DOCUMENTS

| | | |
|---|---|---|
| 10,942,227 B2 | 3/2021 | Offermann |
| 2003/0102860 A1 | 6/2003 | Haji-Sheikh et al. |
| 2018/0247869 A1* | 8/2018 | Zechmann .......... H01L 29/0649 |
| 2020/0365515 A1* | 11/2020 | Su ........................ H01L 24/20 |
| 2020/0408854 A1* | 12/2020 | Offermann .......... G01R 33/0047 |

FOREIGN PATENT DOCUMENTS

| | | | |
|---|---|---|---|
| DE | 102015224255 A1 | 6/2017 | |
| DE | 102020117731 A1 | 1/2021 | |
| KR | 20200094679 A * | 8/2020 | ....... H01L 29/42392 |

* cited by examiner

*Primary Examiner* — Amy He
(74) *Attorney, Agent, or Firm* — Harrity & Harrity, LLP

(57) ABSTRACT

A wheel sensor arrangement can include a first wheel speed sensor and a second wheel speed sensor. The first wheel speed sensor can include or be implemented with a first semiconductor die and can provide data regarding a speed of a rotating wheel. The second wheel speed sensor can also include or be implemented with a second semiconductor die and can provide data regarding the speed of the rotating wheel. The second semiconductor die can be galvanically isolated from the first semiconductor die. The wheel sensor arrangement can include a mold housing that forms around the first wheel speed sensor and the second wheel speed sensor. The mold housing can include a separation feature between the first sensor and the second sensor.

20 Claims, 14 Drawing Sheets

SYSTEMS AND DEVICES FOR WHEEL SENSORS

RELATED APPLICATION

This application claims priority to German Patent Application No. 102021120398.8 filed on Aug. 5, 2021, which is incorporated herein by reference in its entirety.

FIELD

Various embodiments generally relate to wheel sensor systems.

BACKGROUND

Vehicles include redundant wheel speed sensors are required by redundant braking systems, which are important, especially for ensuring fail safe operations, including for autonomous driving applications. State of the art wheel speed sensor integrated circuits (ICs) include a single die into a two-pin package. A wheel speed sensor is placed at each wheel and thus up to four sensors can be used in a single vehicle. For redundancy reasons, some implementations of wheel speed sensors include an additional IC or semiconductor die in one overmolded module or package. This redundancy approach is problematic because both semiconductor dies or ICs can be susceptible to cracking or fracturing occurring in the overmolded package.

SUMMARY

One or more embodiments is directed to a wheel sensor arrangement including: a first wheel speed sensor including a first semiconductor die, the first wheel speed sensor configured to provide data regarding a speed of a rotating wheel; a second wheel speed sensor including a second semiconductor die, the second wheel speed sensor configured and to provide data regarding the speed of the rotating wheel, wherein the second semiconductor die is galvanically isolated from the first semiconductor die; and a mold housing formed around the first wheel speed sensor and the second wheel speed sensor, the mold housing including a separation feature between the first sensor and the second sensor.

One or more embodiments is directed to a wheel sensor system that includes a wheel sensor arrangement, a wheel including a pole wheel, and a sensor encoder mounted on the pole wheel and configured to actuate wheel speed sensor data in the first wheel speed sensor and in the second wheel speed sensor. The wheel sensor arrangement includes: a first wheel speed sensor including a first semiconductor die, the first wheel speed sensor configured to provide data regarding a speed of a rotating wheel; a second wheel speed sensor including a second semiconductor die, the second wheel speed sensor configured and to provide data regarding the speed of the rotating wheel, wherein the second semiconductor die is galvanically isolated from the first semiconductor die; and a mold housing formed around the first wheel speed sensor and the second wheel speed sensor, the mold housing including a separation feature between the first sensor and the second sensor.

BRIEF DESCRIPTION OF THE DRAWINGS

In the drawings, like reference characters generally refer to the same parts throughout the different views. The drawings are not necessarily to scale; emphasis instead generally being placed upon illustrating the principles of the invention. In the following description, various embodiments of the invention are described with reference to the following drawings, in which.

DETAILED DESCRIPTION

Figure 1A:
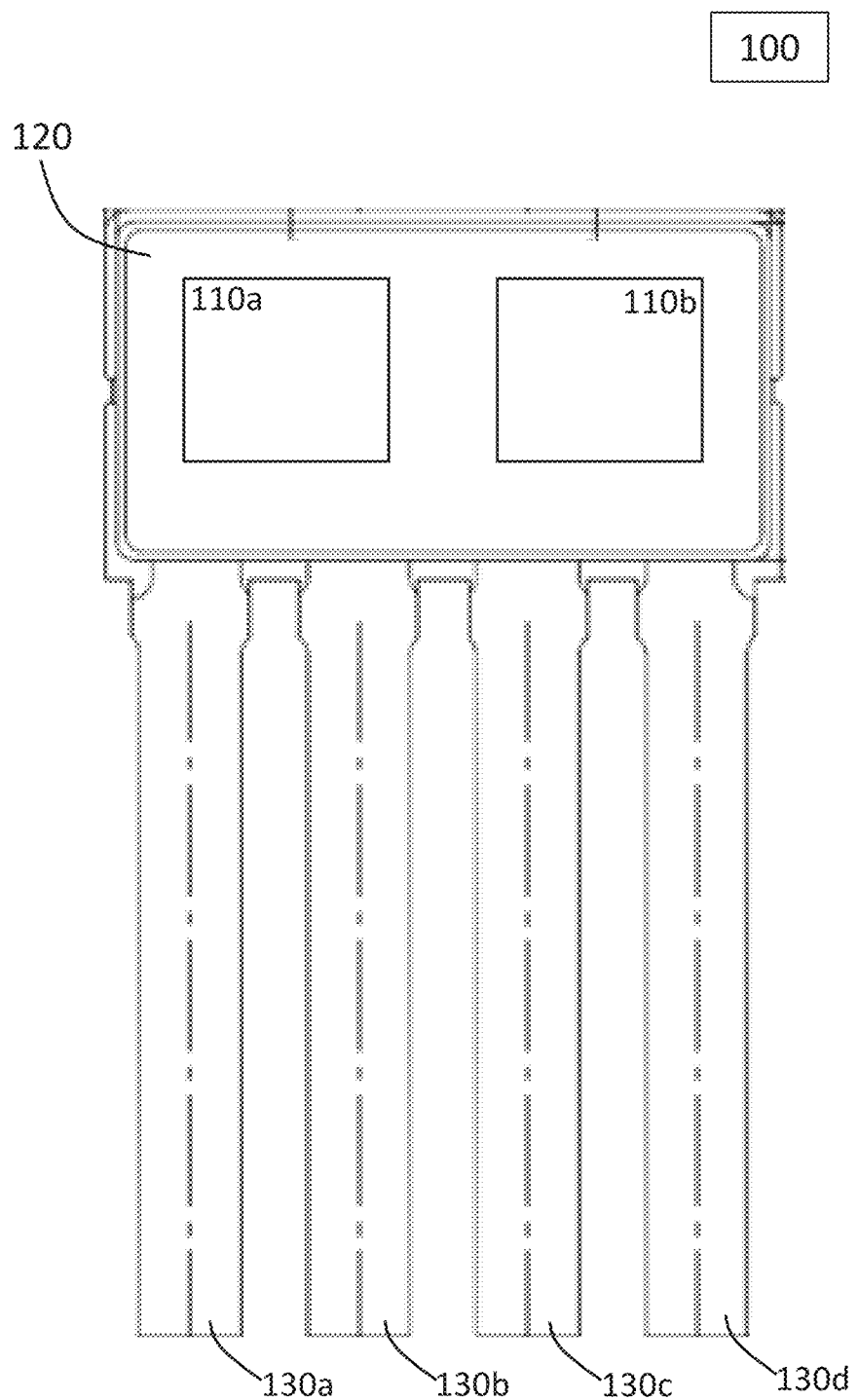
FIGS. 1A and 1B are diagrams illustrating a wheel sensor arrangement.

The following detailed description refers to the accompanying drawings that show, by way of illustration, specific details and embodiments in which the invention may be practiced.

The word "exemplary" is used herein to mean "serving as an example, instance, or illustration." Any embodiment or design described herein as "exemplary" is not necessarily to be construed as preferred or advantageous over other embodiments or designs.

The words "plurality" and "multiple" in the description or the claims expressly refer to a quantity greater than one. The terms "group (of)", "set [of]", "collection (of)", "series (of)", "sequence (of)", "grouping (of)", etc., and the like in the description or in the claims refer to a quantity equal to or greater than one, i.e., one or more. Any term expressed in the plural form that does not expressly state "plurality" or "multiple" likewise refers to a quantity equal to or greater than one. The terms "proper subset", "reduced subset", and "lesser subset" refer to a subset of a set that is not equal to the set, i.e., a subset of a set that contains fewer elements than the set.

The terms "at least one" and "one or more" may be understood to include a numerical quantity greater than or equal to one (e.g., one, two, three, four, [ . . . ], etc.).

As used herein, unless otherwise specified, the use of the ordinal adjectives "first", "second", "third", etc., to describe a common object merely indicate that different instances of like objects are being referred to, and are not intended to imply that the objects so described must be in a given sequence, either temporally, spatially, in ranking, or in any other manner.

The term "data" as used herein may be understood to include information in any suitable analog or digital form, e.g., provided as a file, a portion of a file, a set of files, a signal or stream, a portion of a signal or stream, a set of signals or streams, and the like. Further, the term "data" may also be used to mean a reference to information, e.g., in the form of a pointer. However, the term data is not limited to the aforementioned examples and may take various forms and represent any information as understood in the art.

The term "processor" or "controller" as, for example, used herein may be understood as any kind of entity that allows handling data, signals, etc. The data, signals, etc., may be handled according to one or more specific functions executed by the processor or controller.

A processor or a controller may thus be or include an analog circuit, digital circuit, mixed-signal circuit, logic circuit, processor, microprocessor, Central Processing Unit (CPU), Neuromorphic Computer Unit (NCU), Graphics Processing Unit (GPU), Digital Signal Processor (DSP), Field Programmable Gate Array (FPGA), integrated circuit, Application Specific Integrated Circuit (ASIC), etc., or any combination thereof. Any other kind of implementation of the respective functions, which will be described below in further detail, may also be understood as a processor, controller, or logic circuit. It is understood that any two (or more) of the processors, controllers, or logic circuits detailed herein may be realized as a single entity with equivalent functionality or the like, and conversely that any single processor, controller, or logic circuit detailed herein may be realized as two (or more) separate entities with equivalent functionality or the like.

A "circuit" as used herein is understood as any kind of logic-implementing entity, which may include special-purpose hardware or a processor executing software. A circuit may thus be an analog circuit, digital circuit, mixed-signal circuit, logic circuit, processor, microprocessor, signal processor, Central Processing Unit ("CPU"), Graphics Processing Unit ("GPU"), Neuromorphic Computer Unit (NCU), Digital Signal Processor ("DSP"), Field Programmable Gate Array ("FPGA"), integrated circuit, Application Specific Integrated Circuit ("ASIC"), etc., or any combination thereof. Any other kind of implementation of the respective functions, which will be described below in further detail, may also be understood as a "circuit." It is understood that any two (or more) of the circuits detailed herein may be realized as a single circuit with substantially equivalent functionality. Conversely, any single circuit detailed herein may be realized as two (or more) separate circuits with substantially equivalent functionality. Additionally, references to a "circuit" may refer to two or more circuits that collectively form a single circuit.

As utilized herein, terms "module", "component," "system," "circuit," "element," "interface," "slice," "circuitry," and the like are intended to refer to a set of one or more electronic components, a computer-related entity, hardware, software (e.g., in execution), and/or firmware. For example, circuitry or a similar term can be a processor, a process running on a processor, a controller, an object, an executable program, a storage device, and/or a computer with a processing device. By way of illustration, an application running on a server and the server can also be circuitry. One or more circuits can reside within the same circuitry, and circuitry can be localized on one computer and/or distributed between two or more computers. A set of elements or a set of other circuits can be described herein, in which the term "set" can be interpreted as "one or more."

As used herein, a "signal" may be transmitted or conducted through a signal chain in which the signal is processed to change characteristics such as phase, amplitude, frequency, and so on. The signal may be referred to as the same signal even as such characteristics are adapted. In general, so long as a signal continues to encode the same information, the signal may be considered as the same signal.

As used herein, a signal that is "indicative of" a value or other information may be a digital or analog signal that encodes or otherwise communicates the value or other information in a manner that can be decoded by and/or cause a responsive action in a component receiving the signal. The signal may be stored or buffered in a computer-readable storage medium prior to its receipt by the receiving component. The receiving component may retrieve the signal from the storage medium. Further, a "value" that is "indicative of" some quantity, state, or parameter may be physically embodied as a digital signal, an analog signal, or stored bits that encode or otherwise communicate the value.

It will be understood that when an element is referred to as being "connected" or "coupled" to another element, it can be physically connected or coupled to the other element such that current and/or electromagnetic radiation (e.g., a signal) can flow along a conductive path formed by the elements. Intervening conductive, inductive, or capacitive elements may be present between the element and the other element when the elements are described as being coupled or connected to one another. Further, when coupled or connected to one another, one element may be capable of inducing a voltage or current flow or propagation of an electromagnetic wave in the other element without physical contact or intervening components. Further, when a voltage, current, or signal is referred to as being "applied" to an element, the voltage, current, or signal may be conducted to the element by way of a physical connection or by way of capacitive, electromagnetic, or inductive coupling that does not involve a physical connection.

As used herein, "memory" is understood as a non-transitory computer-readable medium where data or information can be stored for retrieval. References to "memory" included herein may thus be understood as referring to volatile or non-volatile memory, including random access memory (RAM), read-only memory (ROM), flash memory, solid-state storage, magnetic tape, hard disk drive, optical drive, etc., or any combination thereof. Furthermore, registers, shift registers, processor registers, data buffers, etc., are also embraced herein by the term memory. A single component referred to as "memory" or "a memory" may be composed of more than one different type of memory and thus may refer to a collective component comprising one or more types of memory. Any single memory component may be separated into multiple collectively equivalent memory components and vice versa. Furthermore, while memory may be depicted as separate from one or more other components (such as in the drawings), memory may also be integrated with other components, such as on a common integrated chip or a controller with an embedded memory.

The term "software" refers to any type of executable instruction, including firmware.

Exemplary embodiments of the present disclosure may be realized by one or more computers (or computing devices) reading out and executing computer-executable instructions recorded on a storage medium (e.g., non-transitory computer-readable storage medium) to perform the functions of one or more of the herein-described embodiment(s) of the disclosure. The computer(s) may comprise one or more of a central processing unit (CPU), a microprocessing unit (MPU), or other circuitry, and may include a network of separate computers or separate computer processors. The computer-executable instructions may be provided to the computer, for example, from a network or a non-volatile computer-readable storage medium. The storage medium may include, for example, one or more of a hard disk, a random-access memory (RAM), a read-only memory (ROM), a storage of distributed computing systems, an optical drive (such as a compact disc (CD), digital versatile disc (DVD), or Blu-ray Disc (BD), a flash memory device, a memory card, and the like. By way of illustration, specific details and embodiments in which the invention may be practiced.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

As used herein, unless otherwise specified the use of the ordinal adjectives "first", "second", "third" etc., to describe a common object, merely indicate that different instances of like objects are being referred to, and are not intended to imply that the objects so described must be in a given sequence, either temporally, spatially, in ranking, or in any other manner.

The term "semiconductor substrate" or "semiconductor die" is defined to mean any construction comprising semiconductor material, for example, a silicon substrate with or without an epitaxial layer, a silicon-on-insulator substrate containing a buried insulator layer, or a substrate with a silicon germanium layer. The term "integrated circuits" as used herein refers to electronic circuits having multiple individual circuit elements, such as transistors, diodes, resistors, capacitors, inductors, and other active and passive semiconductor devices. A conductive region formed in and/or on the semiconductor substrate or semiconductor die is a portion of conductive routes and has exposed surfaces that may be treated by a planarization process, such as chemical mechanical polishing. Suitable materials for the conductive regions may include, but not limited to, for example copper, aluminum, copper alloy, or other mobile conductive materials. Copper interconnect level may be the first or any subsequent metal interconnect level of the semiconductor device.

FIG. 1A shows a diagram illustrating a wheel sensor arrangement 100. The wheel sensor arrangement or device 100 includes a first wheel speed sensor 110a and a second wheel speed sensor 110b implemented in a single package or housing 120. The first wheel speed sensor 110a and the second wheel speed sensor 110b each include or are implemented with a semiconductor die or substrate which includes various circuitry or components to implement wheel speed sensor functions, such as one or more magnetic sensors.

The first wheel speed sensor 110a can generate and output data, e.g., a data signals, indicating the rotational speed or velocity of a rotatable wheel. The rotatable wheel may include an encoder that causes affects the environmental in a way that can be detected by the wheel speed sensor 110a to the generate wheel speed information, e.g., the rotational speed data.

In one example, a rotatable wheel may include a magnetic encoder that can produce or generate magnetic fields during the rotation of the wheel. The generated magnetic fields can generate in the wheel speed sensor 110a an electric current or voltage with characteristics, e.g., frequencies, amplitudes, that are related or proportional to the changing magnetic field and thus relate or are proportional to rotational speed of the wheel.

As previously stated, the wheel speed sensor 110a may include a magnetic sensor or magnetic field sensor such as, a Hall sensor, or a magneto-resistive sensor. The wheel speed sensor 110a may also include other circuit components, including for example a processor, that may process data or data signals produced by the magnetic sensor(s) of the wheel speed sensor 110a. These components may be implemented on a semiconductor die or substrate of the wheel speed sensor 110a.

The second wheel speed sensor 110b can operate similarly as the first wheel speed sensor 110a. In other words, the second wheel speed sensor 110b can serve as a backup and thus include or provide the same or similar components and functions as the first wheel speed sensor 110a, including generating data or data signals indicating the rotational speed of the rotatable wheel. In some cases, the wheel speed sensor 110b may be an identical version of the first wheel speed sensor 110a.

As shown in FIG. 1A, the first and second wheel speed sensors 110a and 110b are both co-located in a packaging or housing 120. The housing may be an overmolding or a mold housing/packaging 120. The mold housing 120 surrounds or encloses both the first wheel speed sensor 110a and the second wheel speed sensor 110b.

The wheel sensor arrangement 100 include connector pins 130a-130d which includes the pins 130a and 130b being electrically coupled or connected to the first wheel speed sensor 110a and the pins 130c and 130d electrically coupled or connected to the second wheel speeds sensor 110b. The first wheel speed sensor 110a and the second wheel speed sensor 110b each can be mounted on its own lead frame which can electrically couple to the pins 130a-130d.

Wheel sensor arrangements such as or similar to wheel sensor arrangement 100 are susceptible to cracking or fracturing due to, e.g., external stresses, pressures, or other factors. Moreover, cracking or fracturing in one area of the packaging can spread. For example, emerging or originating in section can spread throughout the housing and through both of the wheel speed sensors 110a and 110b.

Figure 1B:
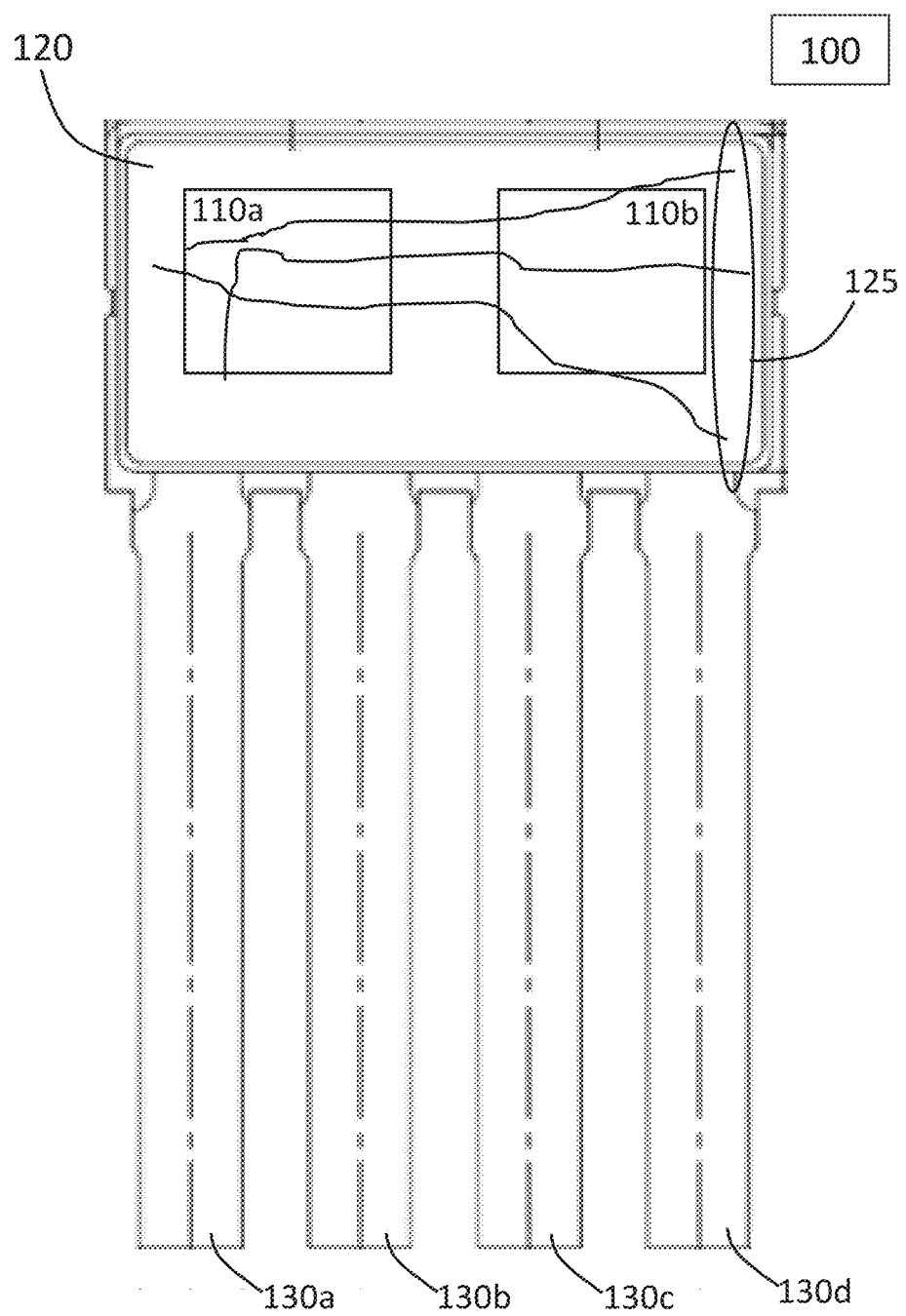

FIG. 1B, which an example of cracks 125 in the housing 120 that extend throughout the housing 120 and through both the wheel speed sensors 110a and 110b.

Figure 2A:
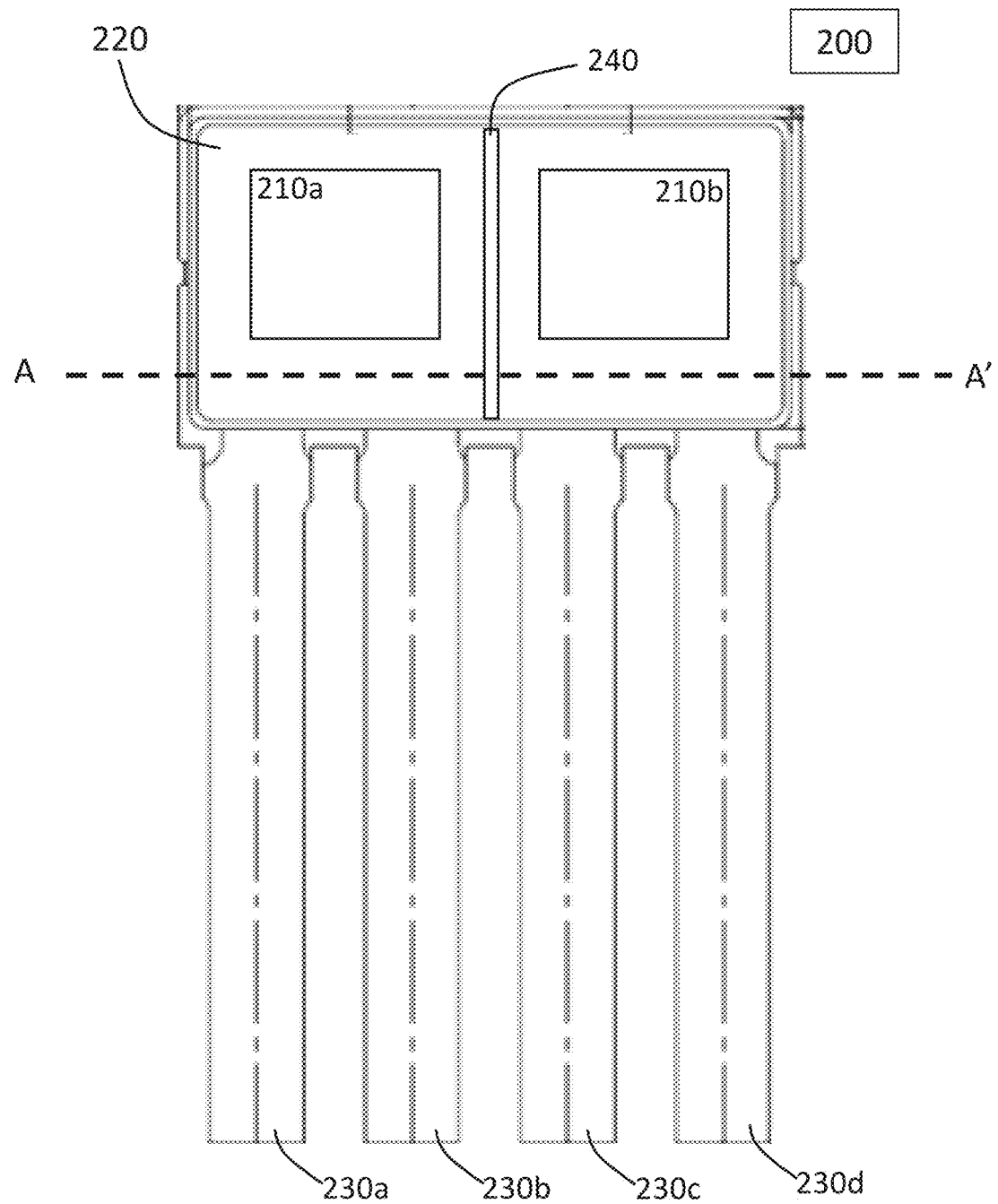
FIGS. 2A-2C depict a wheel sensor arrangement according to at least one exemplary embodiment of the present disclosure.

FIG. 2A shows a wheel sensor arrangement or device 200 according to at least one exemplary embodiment of the present disclosure. The wheel sensor arrangement 200 may be similar in some aspects to the wheel sensor arrangement 100 of FIG. 1A. For example, the wheel sensor arrangement 200 includes at least a first wheel speed sensor 210a and a second wheel speed sensor 210b. The first wheel speed sensor 210a and the second wheel speed sensor 210b may be the same or similar to the wheel speed sensors of FIG. 1A and both are embedded in the mold housing 220.

The first wheel speed sensor 210a and the second wheel speed sensor 210b each may include or be implemented on a respective semiconductor die or substrate that is mounted on a lead frame. That is, the first wheel speed sensor 210a includes a semiconductor die or substrate 212a (first semiconductor die) mounted on a lead frame 214a (first lead frame) while the second speed sensor 210b includes a substrate 212b (second semiconductor die) mounted on a lead frame 214b (second lead frame), as depicted in FIG. 2C. The first semiconductor die 212a and the second semiconductor die 212b each include a first major surface opposing a second major surface. In the example of FIG. 2C, the first major surface of the first and second semiconductor dies are each substantially parallel and/or coplanar to each other. In FIG. 2A, the first major surfaces of the first semiconductor die 212a and second semiconductor die 212b are shown. Further, as shown, the first semiconductor die 212a is positioned horizontally away from the second semiconductor die 212b.

In at least one exemplary embodiment, the first wheel speed sensor 210a may operate independently from the second wheel speed sensor 210b. Further, the first wheel speed sensor 210a can be galvanically isolated or electrically separated from the wheel speed sensor 210b.

The wheel sensor arrangement 200 includes pins 230a-230d. The pins 230a and 230b are electrically coupled to the first wheel speed sensor 210a while the pins 230c and 230d are electrically coupled to the second wheel speed sensor 210b. The pins 230a-d can each extend from one the first or second wheel speed sensors 210a or 210b, inside the mold housing 220, to an environment outside of the mold housing 220 for connection to another device or component.

The mold housing 220 surrounds or encloses the first wheel speed sensor 110a and the second wheel speed sensor 110b. Moreover, the mold housing 220 includes a separation feature 240. The separation feature 240 can be an area or region of the mold housing 220 between the first and second wheel speed sensors 110a and 110b. As shown in FIG. 2A, from a front perspective the separation feature 240 can separate the mold housing 220 into two regions, sides or halves. The first wheel speed sensor 210a is located in one region and the second wheel speed sensor 210b is located in the second region formed by the mold housing 220.

The separation feature 240 may provide a mechanical barrier in the mold housing 220 that can "catch", stop, and/or redirect a mechanical damage that emerges in the wheel sensor arrangement 200. For example, the separation feature 240 may be a crack stop barrier. One or more cracks originating in one region of the mold housing 220 can be prevented from further spreading, e.g., to another region by the separation feature 240. In one example, the separation feature 240 can cause cracks to spread along or within the separation feature 240 after reaching the separation feature 240.

Figure 2B:
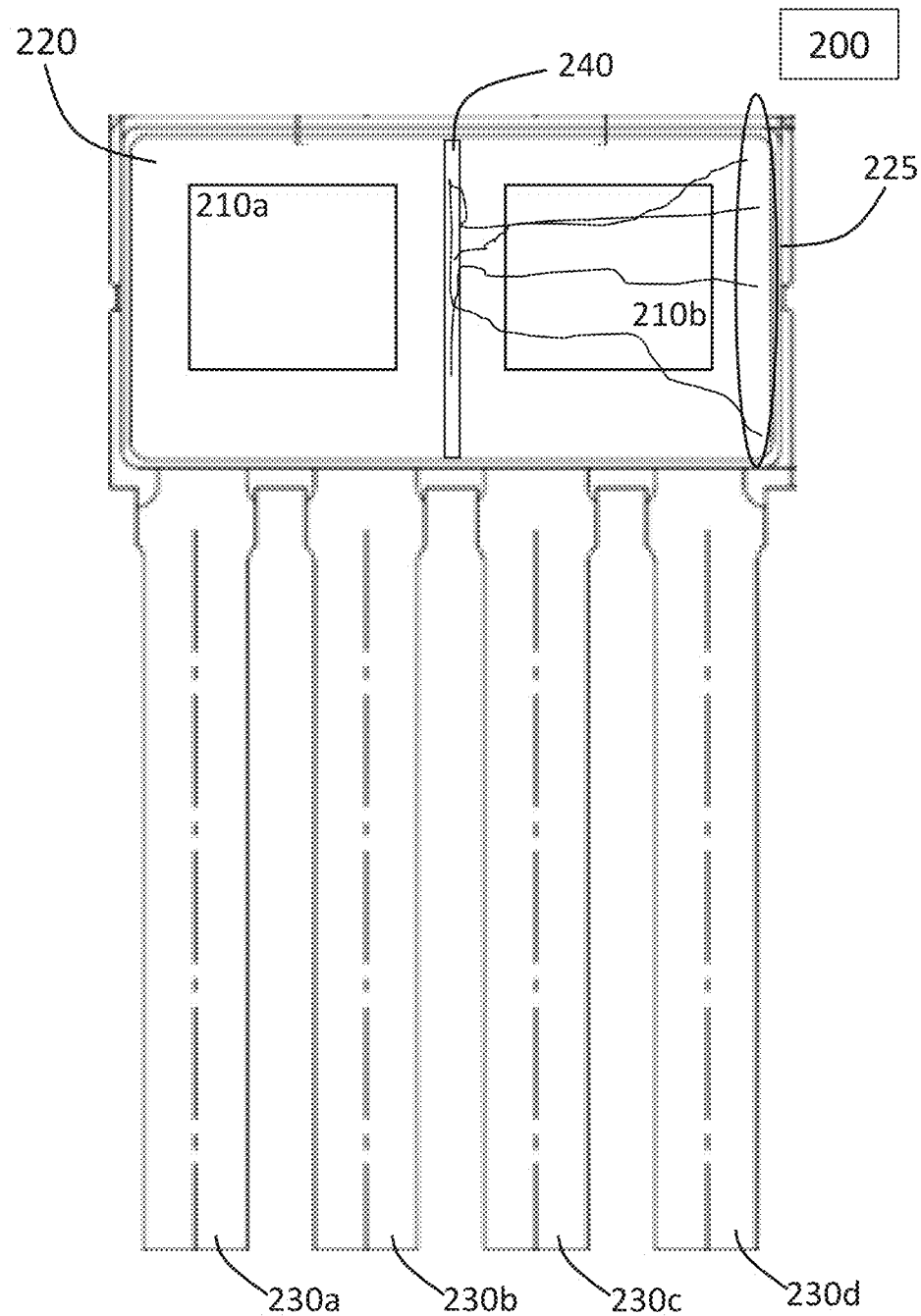
Figure 2C:
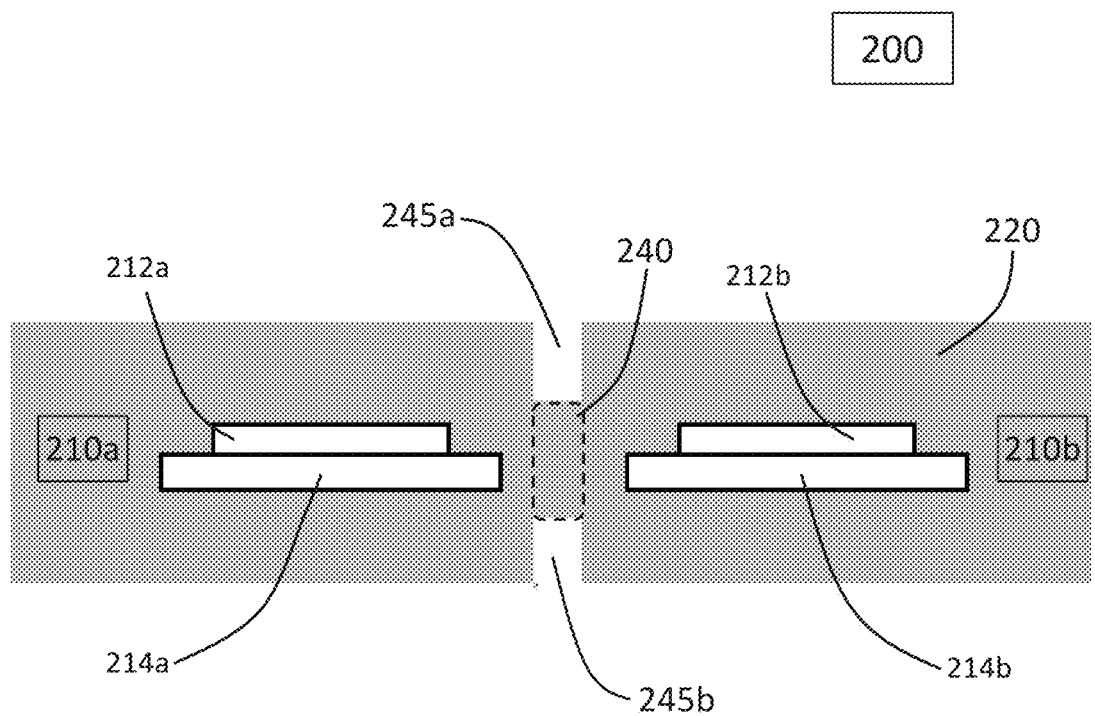

FIG. 2B shows cracks 225 that have originated, from a front perspective, in the right side (e.g., right side along x-direction) of the mold housing 240 and to the right of the separation feature 240. The separation feature 240 prevents the cracks 225 from extending beyond to another section, e.g., to left section of the wheel sensor arrangement 200 and potentially spreading to and damaging the first wheel speed sensor 210a. Therefore, the first wheel speed sensor 210a and first semiconductor die 212a can be protected from cracks that damage the second wheel speed sensor 210b. Indeed, as shown, the cracks 225 that reach or touch the separation feature 240 are captured by the separation feature 240. The captures cracks 225 do not extend past the separation feature 240 (e.g., along the x-direction) in the mold housing 220. Instead, the separation feature 240 guides the cracks 225 to spread further within the separation feature 240.

In short, the separation feature 240 of the mold housing 220 can act as or a provide an effective crack stop barrier. Therefore, in the case where one of the wheel separation speed sensors is damaged and inoperable due to mechanical stress damage (e.g., cracks), the separation feature 240 can prevent the damage from spreading to the other wheel speed sensor which in turn allows the non-damaged wheel speed sensor to continue to operate and/or serve as a back-up the other damaged wheel speed sensor.

The separation feature 240 may be in any suitable form or fashion. In one example, the separation feature 240 may be a weakened area or region of the mold housing 220.

FIG. 2C, which shows a profile view cross-sectional view of the wheel sensor arrangement 200 along line A-A' of FIG. 2A. In FIG. 2C, one example of the separation feature 240 is shown. As shown, the separation feature 240 is located between a pair of opposing recessed indentations or grooves, 245a and 245b. The recessed indentations 245a and 245b of the mold housing 220 can be realized or formed in any suitable manner. In one example the mold housing 220 may be initially formed without the indentations 245a and 245b, and thus be in the form of a block of mold housing encasing or embedding the first and second wheel speed sensors 210a and 210b. Then the recessed indentations 245a and 245b can be formed in the initially formed mold housing.

The recessed indentations 245a and 245b may be formed by suitable process, including, for example, sawing, dicing, and/or laser grooving of the initial mold housing, to name a few.

As a result of forming the recessed indentations 245a and 245b, the separation feature 240 is achieved which can capture or catch mechanical stress damage (e.g., cracks) to prevent further from spreading further beyond the separation feature 240.

Figure 3A:
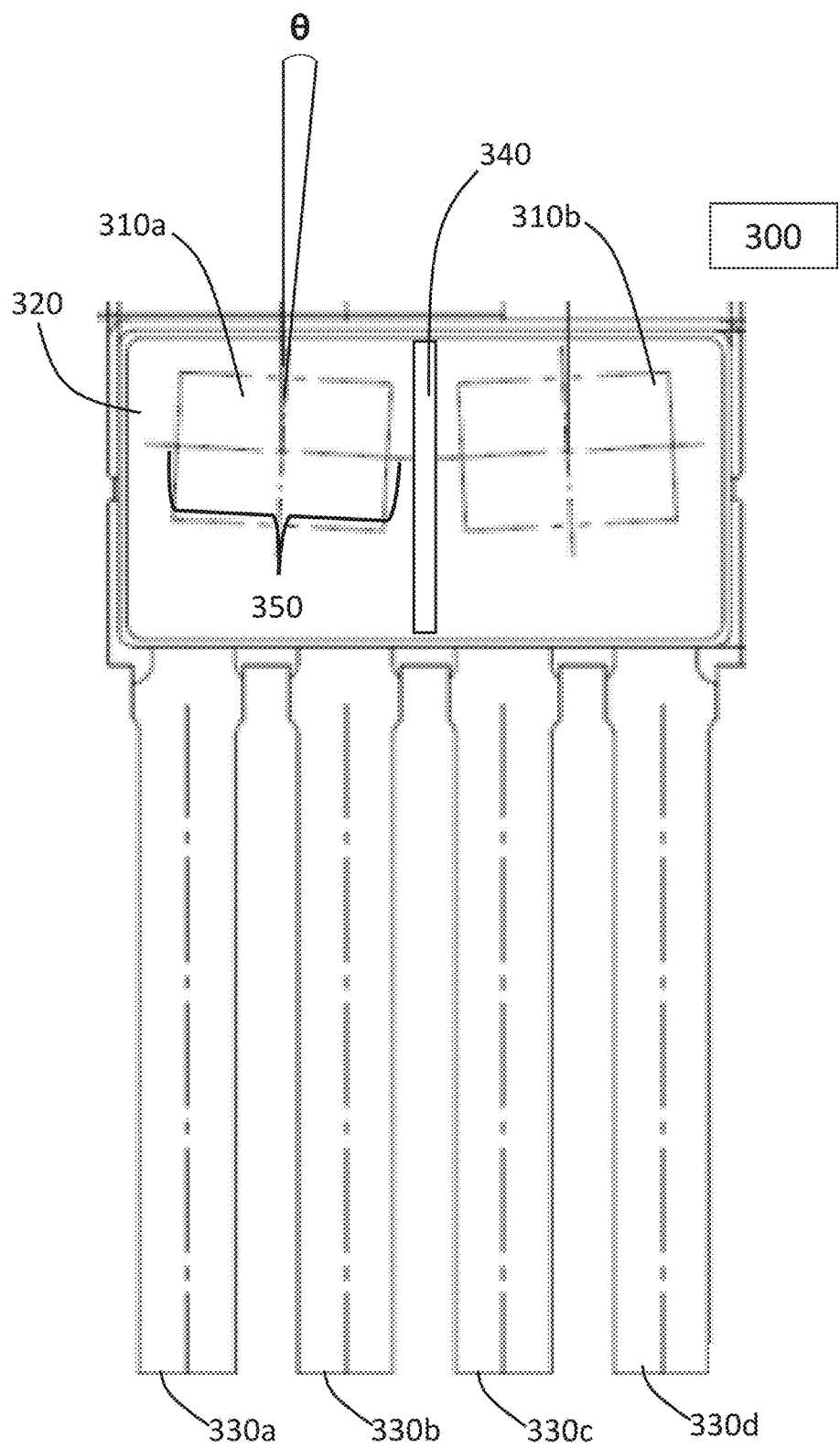
FIGS. 3A and 3B depict another wheel sensor arrangement according to at least one exemplary embodiment of the present disclosure.

FIG. 3A shows another wheel sensor arrangement 300a according to at least one exemplary embodiment of the present disclosure.

The wheel sensor arrangement 300 may be the same as or substantially similar to the wheel sensor arrangement 200 of FIG. 2A in many respects, with the differences explained in the following. The reference numerals of FIG. 3A generally correspond the same reference numeral of FIG. 2A, e.g., 3xx instead of 2xx.

The wheel sensor arrangement 300 includes a first wheel speed sensor 310a and a second wheel speed sensor 310b enclosed within a mold housing 320. A separation feature 340 provides mechanical barrier between sections of the mold housing 320 as explained in context of FIGS. 2A-2C. The first wheel speed sensor 310a and 320b are electrically coupled to the pins 330a with the first wheel speed sensor 310a is electrically coupled to the pins 330a and 330b while the second wheel speed sensor 310b is electrically coupled to the third and fourth pins 330c and 330d.

From a front perspective, the first speed wheel speed sensor 310a and the second wheel speed sensor 310b are each rotated. For example, compared to the corresponding first wheel speed sensor 210a of FIG. 2A, from a front perspective, the first semiconductor die 312a is rotated clockwise by an angle theta, θ. In other words, the first semiconductor die 312a is rotated at a first angle in a plane coplanar with the first major surface of the first semiconductor die 312a.

The angle, theta (θ), can be an angle measured with respect to the y-axis, in the case where the y-axis is aligned or parallel to a sidewall of the mold housing and/or parallel with the extension of the pins 330a-330d. Accordingly, in FIG. 3A, an axis of symmetry of the first semiconductor die 312a is rotated clockwise by angle theta with respect to the y-axis. By contrast, the semiconductor die 212a of FIGS. 2A-2C is not rotated. In FIG. 2A, the axis of symmetry of the first semiconductor die 212a is parallel with the y-axis.

Figure 3B:
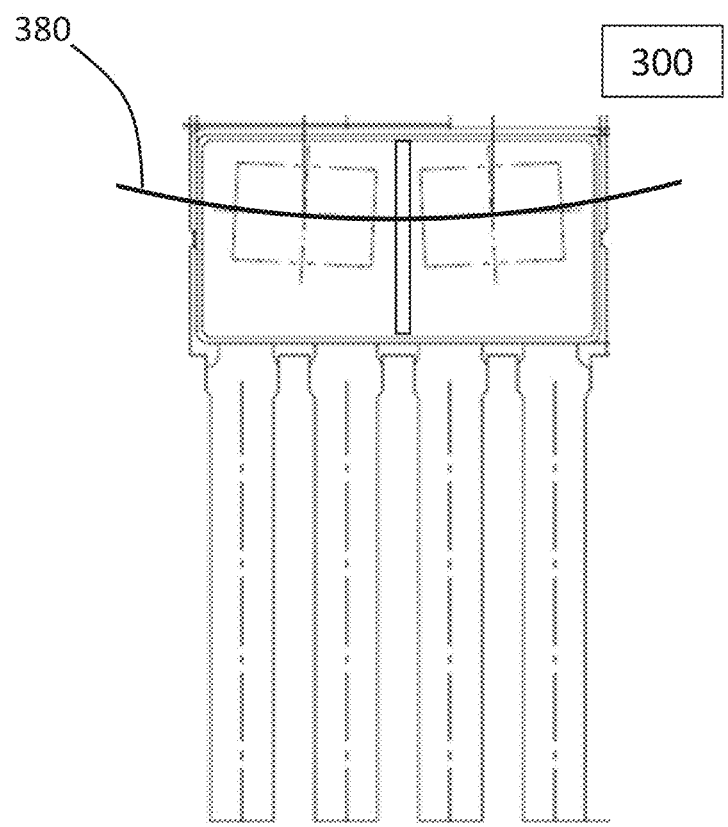

FIG. 3B shows an example of orientation of the first and second semiconductor dies 312a and 312b being aligned with an arc 380 corresponding to a virtual circle. That is, from a front perspective facing the first major surface of the first semiconductor die 312a, the first semiconductor die 312a is rotated so that an arc (section of a circumference) of a virtual circle centered outside of the wheel sensor arrangement intersects the first major surface of the first semiconductor die substantially along its major axis 350. The virtual circle can be coplanar with the first major surface of the first semiconductor die. Further in FIG. 3B, from the front perspective the second semiconductor die 312b is also rotated. Similarly, the second semiconductor die 312b is rotated by same amount or angle theta as the first semiconductor die 312a except counterclockwise. Hence, the arc 380 of the virtual circle centered outside of the wheel sensor arrangement also intersects the first major surface of the second semiconductor die 312b along its major axis 350.

Figure 3C:
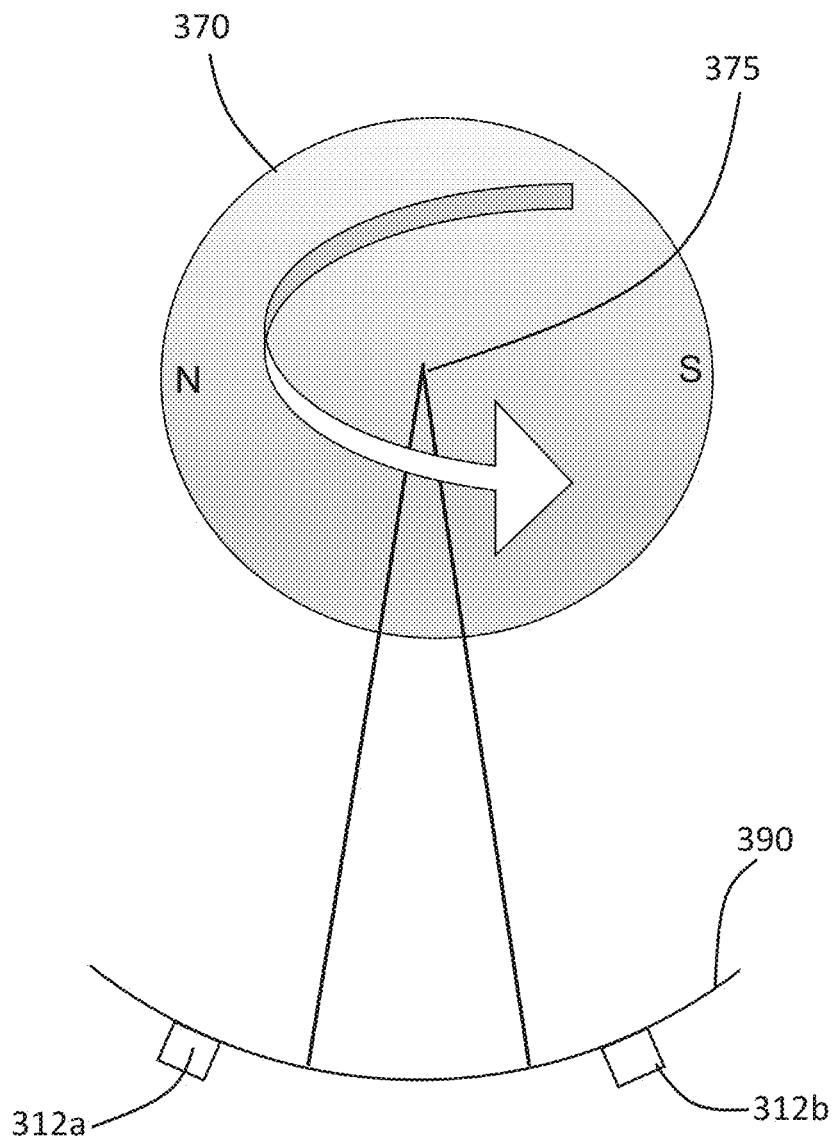
FIG. 3C depicts a pole wheel in relation to wheel speed sensors according to at least one exemplary embodiment of the present disclosure.

FIG. 3C shows that according to at least one exemplary embodiment of the present disclosure, a simplified representation of a pole wheel 370 which can be or act as a magnetic encoder or magnet, as represented by the north (N) and south (S) poles. In FIG. 3C, the first and second semiconductor dies 312a and 312b are shown in the absence of the surrounding wheel speed sensor arrangement 300 for explanatory purposes.

The pole wheel 370 can produce varying magnetic fields as it rotates. The pole wheel 370 rotates circularly around the center 375 as indicated by the arrow. The pole wheel 370 can correspond to the virtual circles described herein. The first semiconductor die 312a can be rotated in a plane coplanar with the first major surface of the first semiconductor die 312a (e.g., XY plane) so that a section of the circumference of a virtual circle having the same center as the pole wheel 370, the center origin 375 intersects or is coincident with the major axis 350 of the first semiconductor die 312a. As explained, the second semiconductor die 312b can be aligned with the first semiconductor die. Thus, the second semiconductor die 312b is rotated in the plane coplanar with the first major surface of the first semiconductor die 312a so that a section of the circumference of the virtual circle sharing the same center 375 of the pole wheel 370 intersects or is substantially coincident with the major axis 350 of the second semiconductor die 312b.

The alignment of the semiconductors dies 312a and 312b can also be shown using an arc 390 of a shorter virtual circle originating at the center 375 would also intersect or be substantially coincident with a front of the semiconductor dies 312a and 312b. In other words, the first and second semiconductor chips 312a and 312b can oriented or aligned so that magnetic fields arriving from the pole wheel arrive at the front arrive at the first and second semiconductors 312a and 312b at the same time after traveled the same distance. Therefore, the first and second semiconductor dies 312a and 312b may include sensors or sensor circuitry be aligned along or parallel to the major axis 350. Such sensors can therefore more accurately or with better resolution generate wheel sensor data based on the alignment or orientation. Accordingly, the boundaries of the second semiconductor die 312b, from a front perspective facing the major surface of the first semiconductor die 312a, appear as a mirror image, e.g., along a y-direction, to boundaries of the first semiconductor die 312a. Further, a distance from a midpoint of the first major surface of the first semiconductor die 312a to the center 375 of the virtual circle can be equal to a distance from a midpoint of the first major surface of the second semiconductor die 312b to the center 375 of the virtual circle.

In short, the first and second semiconductor dies 312a and 312b can be arranged or oriented towards center of pole wheel by a rotated mounting. Further, in some embodiments, the first and second semiconductor dies 312a and 312b can be positioned and oriented so that the second semiconductor die 312b generates wheel speed sensor data that phase shifted ninety (90) degrees relative to the wheel speed sensor data generated by the first semiconductor die 312a.

Figure 4:
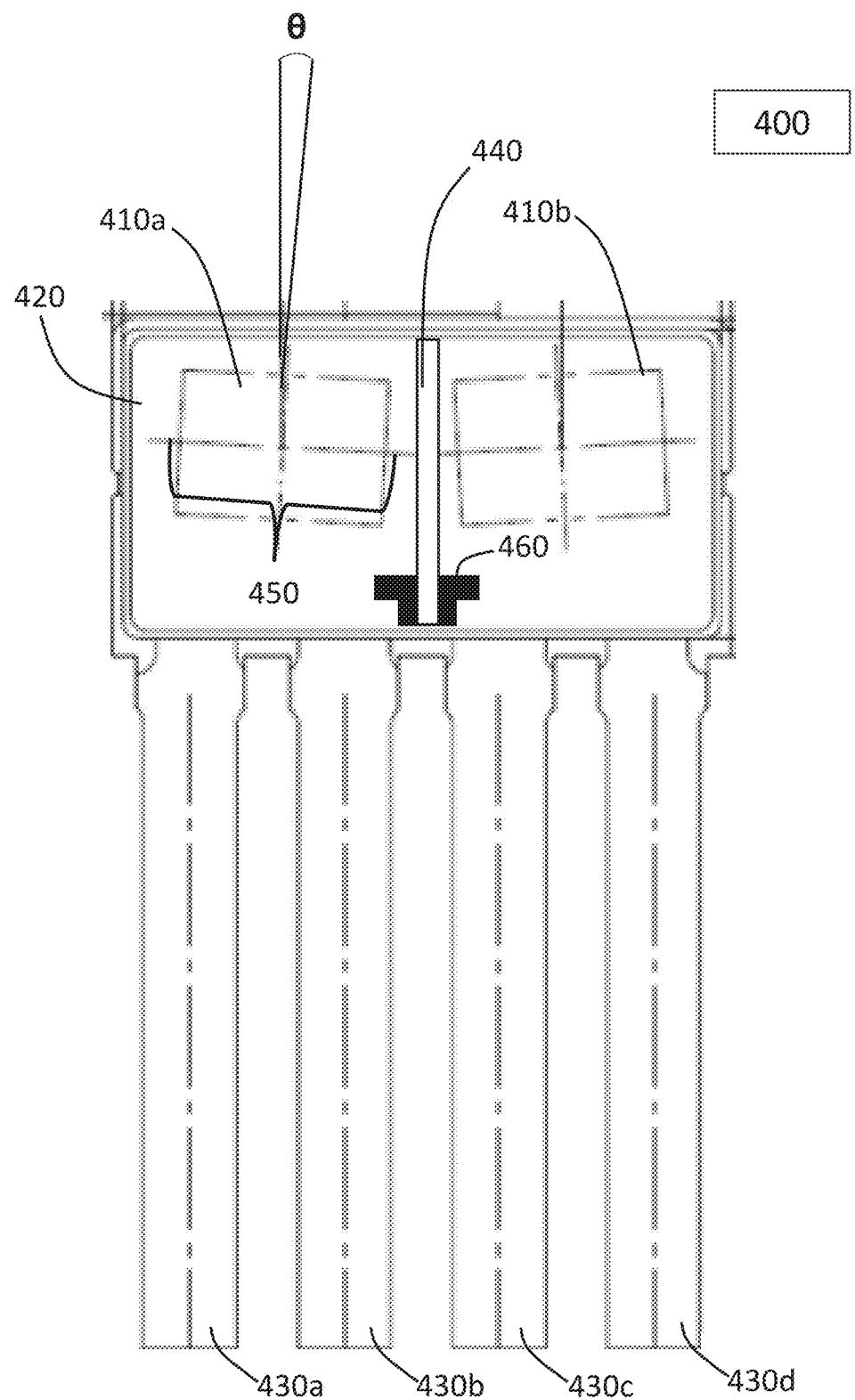
FIG. 4 depicts another wheel sensor arrangement according to at least one exemplary embodiment of the present disclosure.

FIG. 4 shows a wheel sensor arrangement or device 400 according to at least one exemplary embodiment of the present disclosure. The wheel sensor arrangement 400 may be the same or similar to the wheel sensor arrangement 300 in several aspects, with differences explained in the following. As such, reference numerals in FIG. 4 correspond to the reference numerals of FIG. 3A except 4xx instead of 3xx.

The wheel sensor arrangement 400 like the wheel sensor arrangement 300 has a mold housing structure 420 that includes a separation feature 440 disposed, from a front perspective, between the first wheel speed sensor 410a and the second wheel speed sensor 410b. In addition, the wheel sensor arrangement 400 includes an anchor structure 460. From a front perspective, (e.g., facing XY-plane or a major surface of a semiconductor die 412a of the first wheel speed sensor 410a) the anchor structure 460 may have a letter "T" shaped profile. The anchor structure 460 provides mechanical separation and electrical separation between the first and second wheel speed sensors 410a and 410b. Further, the anchor structure 460 can provide additional stability to the mold housing 420 and the wheel sensor arrangement 400 in general.

Figure 5A:
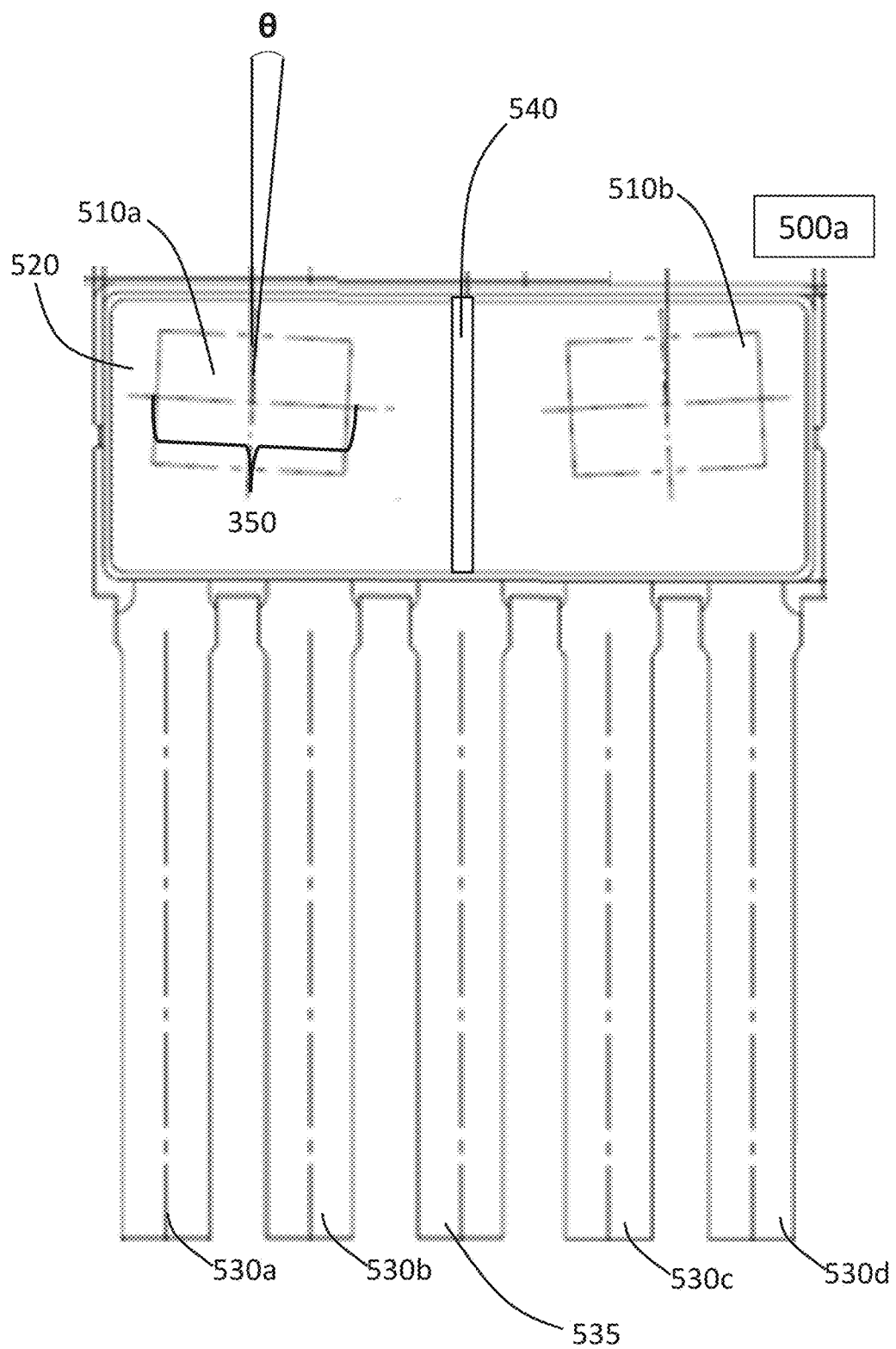
FIG. 5A-5D depict other wheel sensor arrangements according to at least one exemplary embodiment of the present disclosure.

FIG. 5A shows a wheel sensor arrangement or device 500a according to at least one exemplary embodiment of the present disclosure. The wheel sensor arrangement 500a may be the same or similar to the wheel sensor arrangement 300 in several aspects, with differences explained in the following. As such, reference numerals in FIG. 5 correspond to the reference numerals of FIG. 3A except 5xx instead of 3xx.

The wheel sensor arrangement 500a includes pins 530a-530d. As in other embodiments, the first pin 530a and the second pin 530b can be electrically coupled to the first wheel sensor 510a and the third pin 530c and the fourth pin 530d can be electrically coupled to the second wheel sensor 510b. In addition, the wheel sensor arrangement 500a further includes at least one additional pin, the dummy pin 535. The dummy pin 535 can be positioned between the first set of pins (e.g., pins 530a and 530b) and the second set of pins (e.g., 530c and 530d) so as to provide a mechanical barrier between first set of pins and the second set of pins. Further, the dummy pin 535 can provide additional galvanic insulation or increase the galvanic insulating distance between the first set of pins and the second set of pins.

The dummy pin can 535 can be electrically insulating and provide protection (e.g., insulating or mechanical protection) and prevent accidental or inadvertent physical contact between one of the first set of pins and one of the second set of pins. This can prevent accidental or unwarranted electrical shorting between the first and second set of pins.

The dummy pin 535 can extend (along the y-axis) from inside to outside the mold housing 520 and parallel to the pins 530a-530d. The dummy pin 535 may have a length that is as long as, shorter, or the same as any of the other pins 530a-530d. Further, in some embodiments, the electrically conductive.

Figure 5B:
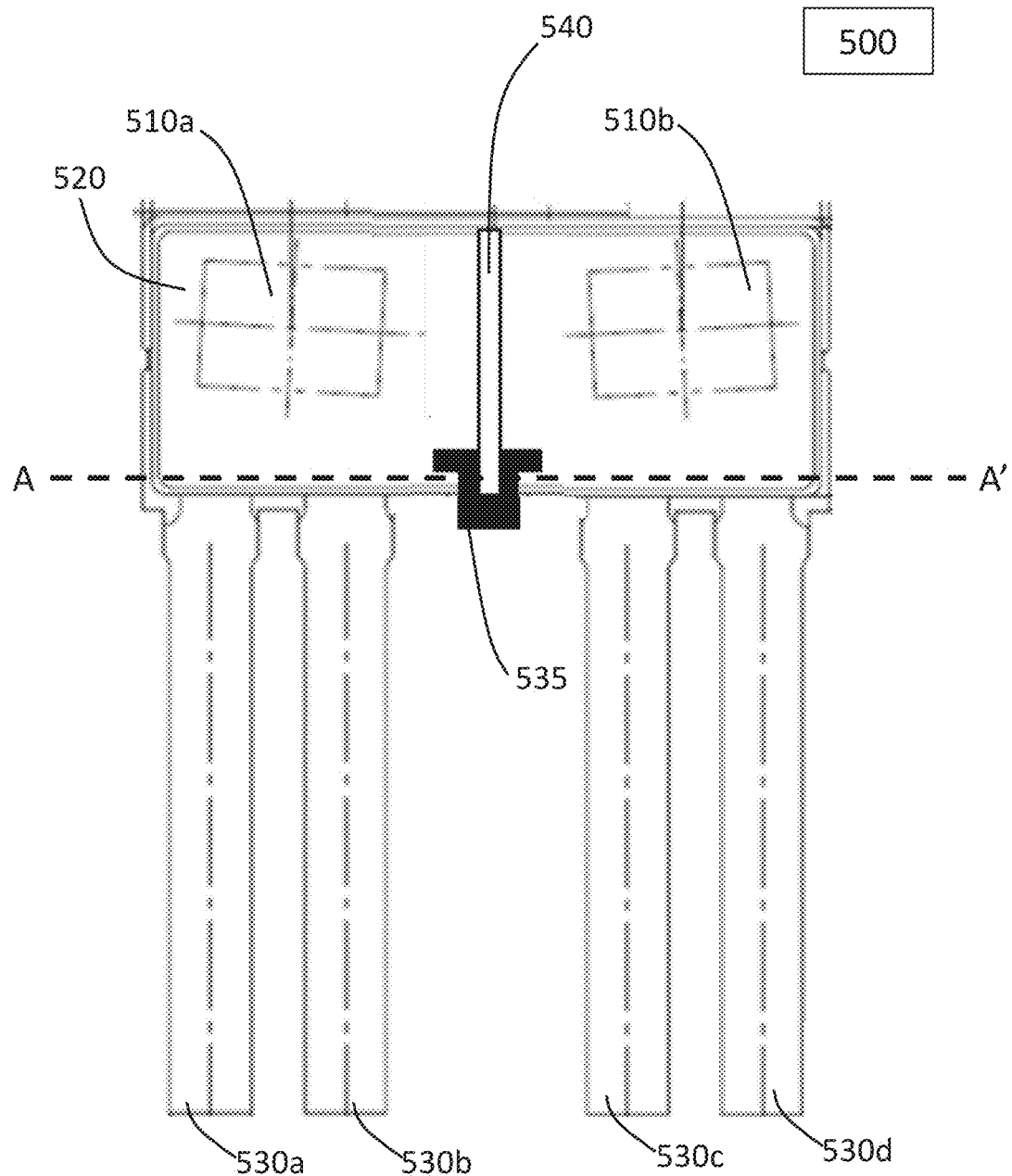

FIG. 5B shows a wheel sensor arrangement 500b that can be similar to and or identical to the wheel sensor arrangement 500a except that the dummy pin 535 is shorter in length. The dummy pin 535 of FIG. 5B may be form as the remain part after a dambar cut for the wheel sensor arrangement 500b. That is, before the cut, the dummy pin anchor 535 may have been mechanically connected to dambars of other pins 530a-530d.

Yet in other embodiments, the dummy pin 535 may only extend within or inside the mold housing 520. For example, the dummy pin 535 may extend from inside the mold housing to a sidewall of the mold housing 520 but not beyond. As in other embodiments, the dummy pin 535 can extend parallel to the first set of pins and/or the second set of pins.

Figure 5C:
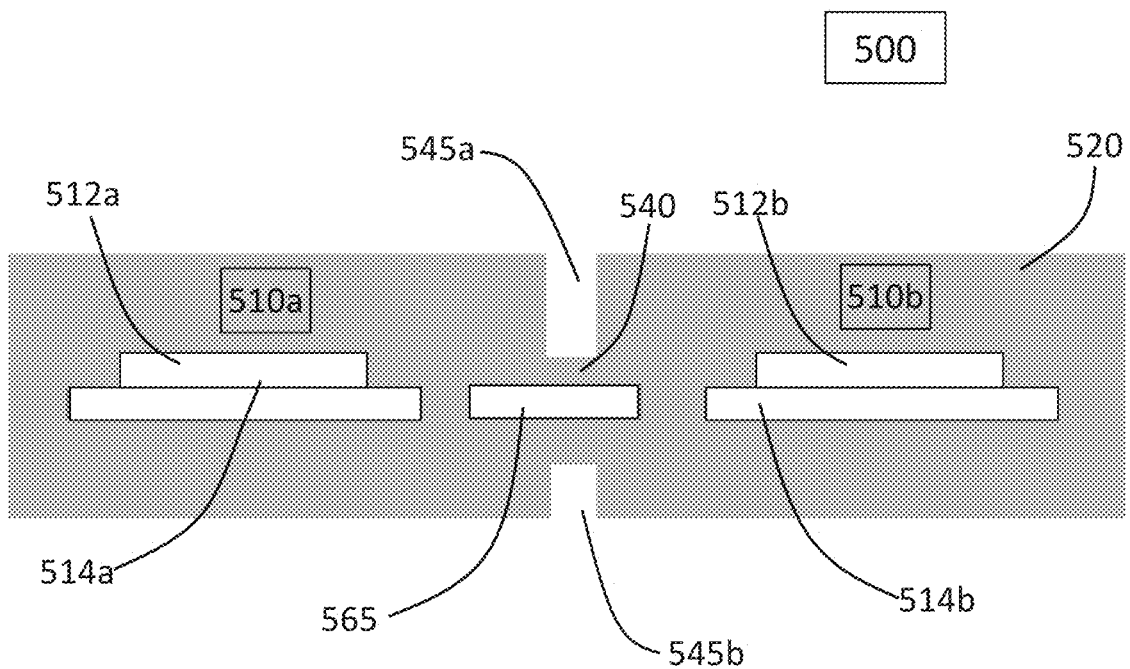

FIG. 5C shows a top cross-section view of the wheel sensor arrangement 500a or 500b. As shown, the dummy pin 535 may be further coupled to a lead frame 565 within the mold housing 520. The lead frame 565 may be located between the lead frames 514a and 514b respectively of the first wheel speed sensor 510a and the second wheel speed sensor 510b.

Figure 5D:
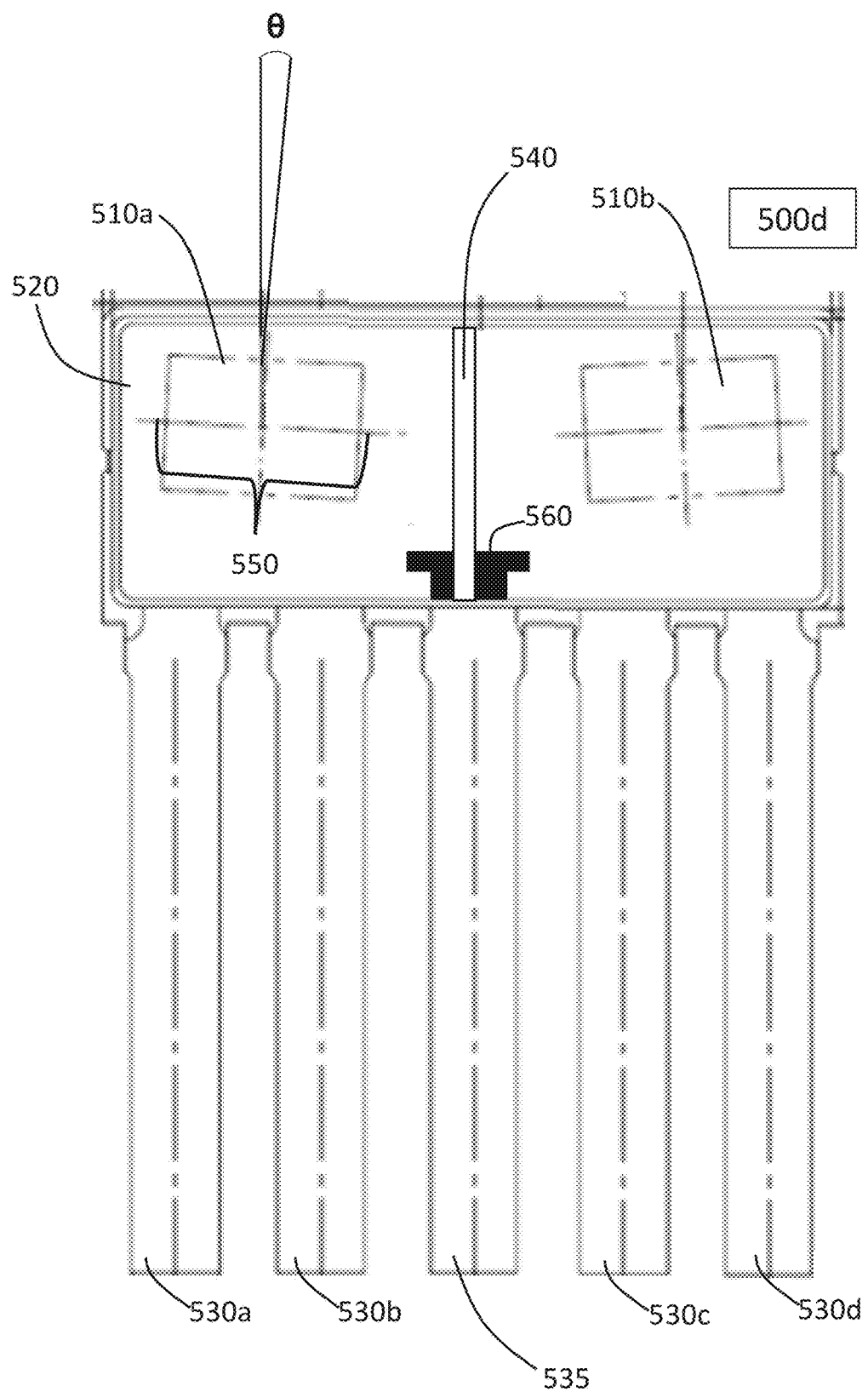

FIG. 5D shows another example of a wheel sensor arrangement 500d. FIG. 5D is a cross-section view with a perspective similar to FIG. 2C. In this example the wheel sensor arrangement 500d may be the same or substantially identical to the wheel sensor arrangement 500a except that the mold housing 520 includes an anchor structure. The anchor structure 560 may be the same or similar to the anchor structure 460 described in the context of FIG. 4. The anchor structure 560 may be mechanically connected or coupled to the dummy pin 535.

Figure 6:
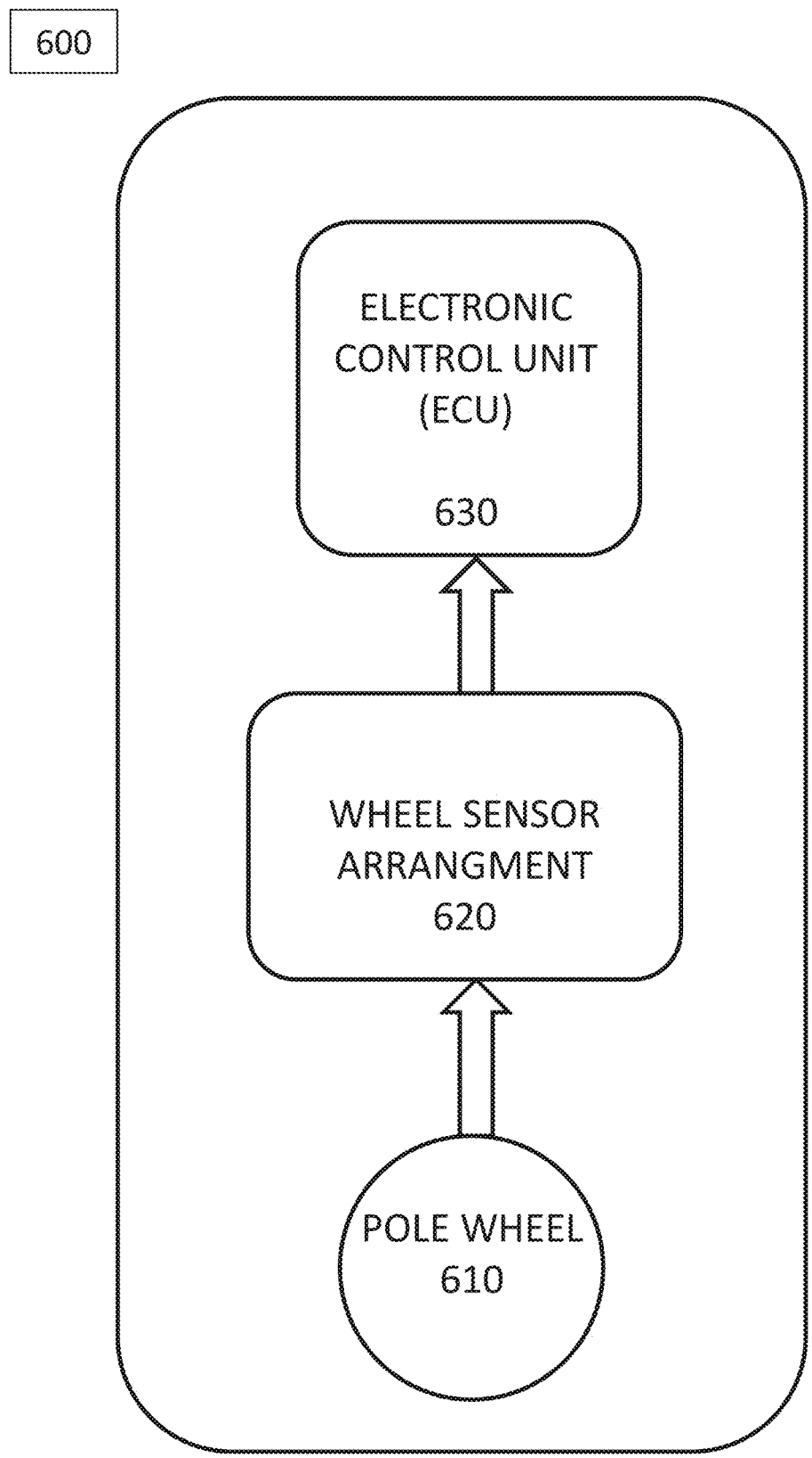
FIG. 6 depicts a wheel sensor system according to at least one exemplary embodiment of the present disclosure.

FIG. 6 shows an exemplary wheel sensor system 600 according to at least one exemplary embodiment of the present disclosure. The wheel sensor system 600 may be implemented or included in a vehicle. The wheel sensor system includes a pole wheel 610, a wheel sensor arrangement or device 620, and an electronic control unit (ECU) 630.

The pole wheel 610 can be connected coupled to a wheel of a motor vehicle. As previously explained the pole wheel 620 may be magnetic or include a magnetic encoder and thus can produce magnetic fields as it rotates with the wheel as described herein.

The wheel sensor arrangement can be the same or similar to any of the wheel sensor arrangements/devices described in FIGS. 2A-5D. The wheel sensor arrangement 620 that can receive and convert magnetic fields produced by the pole wheel 610. The wheel sensor 620 using the magnetic fields can determine and generate sensor data, regarding the rotational speed of the wheel to which the pole wheel 620 attaches. Further, the wheel sensor device 620 may output one or more signals including the sensor data, e.g., indicating the rotational speed of the wheel or other related wheel motion information. The wheel sensor device 620 in particular can output such wheel sensor data signals to the ECU 630.

The ECU 630 may include a computer or computing unit including one or more processors. The ECU receives and processes sensor data obtained from the wheel sensor arrangement 620 and can implement one or more actions or processes. The ECU 630 may control one or more aspects of the vehicle's operation based on the sensor data (e.g., wheel data signals) it receives from the wheel sensor arrangement 620. The ECU 630 based on the wheel data signals and other data it receives may control or influence the vehicle's driving operations, such as braking, steering, etc. The ECU 630 may cause or trigger warning signals or sounds based on the received wheel data signals from the wheel sensor arrangement 620.

While the specific examples described herein relate to wheel sensors or wheel speed sensors, other embodiments may be related to other types of devices or circuitries. For example, the wheel speed sensors may be substituted herein with other circuitries. For example, the device 200 including the first wheel speed sensor 210a and the second wheel speed sensor 210b may instead include a first circuitry and a second circuitry. The first circuitry may include the first semiconductor die 212a and the second circuitry may include the second semiconductor die 212b. The rest of the device 200 may be the same, mutatis mutandis.

Similarly, the other sensor arrangement or devices herein may also be similarly modified to include a circuitry for the specified wheel speed sensors with the rest of device remaining similar, mutatis mutandis. Further, the first and second circuitries used in replace of the wheel speed sensors may be any type of circuitries and may include other types of sensors or sensor circuits.

Example 1 is a wheel sensor arrangement including a first wheel speed sensor comprising a first semiconductor die, the first wheel speed sensor configured to provide data regarding a speed of a rotating wheel; a second wheel speed sensor comprising a second semiconductor die, the second wheel speed sensor configured and to provide data regarding the speed of the rotating wheel, wherein the second semiconductor die is galvanically isolated from the first semiconductor die; a mold housing formed around the first wheel speed sensor and the second wheel speed sensor, the mold housing including a separation feature between the first sensor and the second sensor.

Example 2 is the subject matter of Example 1, wherein the first semiconductor die may include a first major surface opposing a second major surface and the second semiconductor die may include a first major surface opposing a second major surface, and wherein the first major surface of the first and second semiconductor dies are each substantially parallel to each other, and wherein from a front perspective facing the first major surface of the first semiconductor die, the first semiconductor die is positioned horizontally away from the second semiconductor.

Example 3 is the subject matter of Example 2, wherein the first major surface of first semiconductor die may be coplanar with the first major surface of the second semiconductor die.

Example 4 is the subject matter of Example 2 or 3, wherein the first semiconductor die may be rotated at a first angle in a plane coplanar with the first major surface of the first semiconductor die.

Example 5 is the subject matter of Example 4, wherein from a front perspective facing the first major surface of the first semiconductor die, the first semiconductor die may be rotated so that an arc of a virtual circle centered outside of the wheel sensor arrangement intersects the first major surface of the first semiconductor die substantially along a major axis of the first major surface of the first semiconductor die, the virtual circle being coplanar with the first major surface of the first semiconductor die.

Example 6 is the subject matter of Example 4, wherein from a front perspective facing the first major surface of the first semiconductor die, the second semiconductor die may be rotated so that the arc of the virtual circle centered outside of the wheel sensor arrangement intersects the first major surface of the second semiconductor die along a major axis of the first major surface of the second semiconductor die.

Example 7 is the subject matter of Example 6, wherein boundaries of the second semiconductor die may appear as a mirror image to boundaries of the first semiconductor die and wherein a distance from a midpoint of the first major surface of the first semiconductor die to a center of the virtual circle is equal to a distance from a midpoint of the first major surface of the second semiconductor die to the center of the virtual circle.

Example 8 is the subject matter of any of Examples 1 to 7, wherein the first wheel speed sensor may include a first lead frame on which the first semiconductor die is mounted, and the second wheel speed sensor may include a second lead frame on which the second semiconductor die is mounted.

Example 9 is the subject matter of any of Examples 1 to 8, which may further include a first set of pins electrically connected to the first wheel speed sensor, the first set of pins extending from the first wheel speed sensor inside the mold housing to outside of the mold housing; a second set of pins electrically connected to the second wheel speed sensor, the second set of pins extending from the second wheel speed sensor inside the mold housing to outside of the mold housing; and a dummy pin between the first set of pins and the second set of pins so as to provide a mechanical barrier and a galvanic insulation between the first set of pins and the second set of pins.

Example 10 is the subject matter Example 9, wherein the dummy pin may be electrically insulating.

Example 11 is the subject matter Example 9, wherein the dummy pin may be electrically conductive.

Example 12 is the subject matter of any of Examples 9 to 11, wherein the dummy pin extends inside the mold housing at least to a sidewall of the mold housing and parallel to the first set of pins and/or the second set of pins.

Example 13 is the subject matter of Example 12, wherein the dummy pin extends wherein the dummy pin extends from inside the mold housing to outside of the mold housing.

Example 14 is the subject matter of Example 13, wherein the dummy pin extends from inside to outside of the mold housing to a distal end of one of the first set pins and/or the second set of pins.

Example 15 is the subject matter of any of Examples 9 to 14, which may further include an anchor structure inside the mold housing mechanically coupled to the dummy pin, the anchor structure being electrically insulating and located horizontally between the first semiconductor die and the second semiconductor die.

Example 16 is the subject matter of any of the preceding Examples, wherein the separation feature may include a crack stop structure.

Example 17 is the subject matter of any of the preceding Examples, wherein the separation feature may include a weakened area of the mold housing between the first and second semiconductor die.

Example 18 is the subject matter of any of the preceding Examples, wherein the separation feature may be located between a pair of opposed recessed indentations of the mold housing.

Example 19 is the subject matter of Example 18, wherein the pair of opposed recessed notches extend along a periphery of the mold housing.

Example 20 is a wheel sensor system including: a wheel sensor arrangement of any of Examples 1 to 19; a wheel comprising a pole wheel; and a sensor encoder mounted on the pole wheel and configured to actuate wheel speed sensor data in the first wheel speed sensor and in the second wheel speed sensor.

Example 21 is the subject matter of Example 20, wherein the first semiconductor die and the second semiconductor may be equidistant to the sensor encoder so that the first wheel speed sensor is configured to obtain the wheel speed sensor data phase shifted 90 degrees from the wheel speed sensor data obtained from the second wheel speed sensor.

Example 22 is the subject matter of Example 20 or 21, which may further include: an electronic control unit (ECU) configured to obtain wheel speed sensor data from the first and/or second wheel speed sensors.

Example 23 is a device arrangement including: a first circuitry comprising a first semiconductor die; a second circuitry comprising a second semiconductor die galvanically isolated from the first semiconductor die; a mold housing formed around the first semiconductor die and the second semiconductor die, the mold housing including a separation feature between the first semiconductor die and the second semiconductor die.

Example 24 is the subject matter of Example 23, wherein the first semiconductor die may include a first major surface opposing a second major surface and the second semiconductor die may include a first major surface opposing a second major surface, and wherein the first major surface of the first and second semiconductor dies are each substantially parallel to each other, and wherein from a front perspective facing the first major surface of the first semiconductor die, the first semiconductor die may be positioned horizontally away from the second semiconductor.

Example 25 is the subject matter of Example 24, wherein the first major surface of first semiconductor die may be coplanar with the first major surface of the second semiconductor die.

Example 26 is the subject matter of Example 24 or 25, wherein the first semiconductor die may be rotated at a first angle in a plane coplanar with the first major surface of the first semiconductor die.

Example 27 is the subject matter of Example 26, wherein from a front perspective facing the first major surface of the first semiconductor die, the first semiconductor die may be rotated so that an arc of a virtual circle centered outside of the wheel sensor arrangement intersects the first major surface of the first semiconductor die substantially along a major axis of the first major surface of the first semiconductor die, the virtual circle being coplanar with the first major surface of the first semiconductor die.

Example 28 is the subject matter of Example 26, wherein from a front perspective facing the first major surface of the first semiconductor die, the second semiconductor die may be rotated so that the arc of the virtual circle centered outside of the wheel sensor arrangement intersects the first major surface of the second semiconductor die along a major axis of the first major surface of the second semiconductor die.

Example 29 is the subject matter of Example 28, wherein boundaries of the second semiconductor die may appear as a mirror image to boundaries of the first semiconductor die and wherein a distance from a midpoint of the first major surface of the first semiconductor die to a center of the virtual circle is equal to a distance from a midpoint of the first major surface of the second semiconductor die to the center of the virtual circle.

Example 30 is the subject matter of any of Examples 23 to 29, wherein, the first circuitry may include a first lead frame on which the first semiconductor die is mounted, and the second circuitry may include a second lead frame on which the second semiconductor die is mounted.

Example 31 is the subject matter of any of Examples 23 to 30, which may further include: a first set of pins electrically connected to the first circuitry, the first set of pins extending from the first circuitry inside the mold housing to outside of the mold housing; a second set of pins electrically connected to the second circuitry, the second set of pins extending from the second circuitry inside the mold housing to outside of the mold housing; and a dummy pin between the first set of pins and the second set of pins so as to provide a mechanical barrier and a galvanic insulation between the first set of pins and the second set of pins.

Example 32 is the subject matter of Example 31, wherein the dummy pin may be electrically insulating.

Example 33 is the subject matter of Example 31, wherein the dummy pin may be electrically conductive.

Example 34 is the subject matter of any of Examples 31 to 33, wherein the dummy pin may extend inside the mold housing at least to a sidewall of the mold housing and parallel to the first set of pins and/or the second set of pins.

Example 35 is the subject matter of Example 34, wherein the dummy pin may extend from inside the mold housing to outside of the mold housing.

Example 36 is the subject matter of Example 35, wherein the dummy pin may extend from inside to outside of the mold housing to a distal end of one of the first set pins and/or the second set of pins.

Example 37 is the subject matter of any of Examples 31 to 36, which may further include: an anchor structure inside the mold housing mechanically coupled to the dummy pin, the anchor structure being electrically insulating and located horizontally between the first semiconductor die and the second semiconductor die.

Example 38 is the subject matter of any of Examples 23 to 37, wherein the separation feature may include a crack stop structure.

Example 39 is the subject matter of any of Examples 23 to 38, wherein the separation feature may include a weakened area of the mold housing between the first and second semiconductor die.

Example 40 is the subject matter of any of Examples 23 to 39, wherein the separation feature may be located between a pair of opposed recessed indentations of the mold housing.

Example 41 is the subject matter of Example 40, wherein the pair of opposed recessed notches extend along a periphery of the mold housing.

It should be noted that one or more of the features of any of the examples above may be suitably or appropriately combined with any one of the other examples.

The foregoing description has been given by way of example only and it will be appreciated by those skilled in the art that modifications may be made without departing from the broader spirit or scope of the invention as set forth in the claims. The specification and drawings are therefore to be regarded in an illustrative sense rather than a restrictive sense.

The scope of the disclosure is thus indicated by the appended claims and all changes which come within the meaning and range of equivalency of the claims are therefore intended to be embraced.

It is appreciated that implementations of methods detailed herein are demonstrative in nature, and are thus understood as capable of being implemented in a corresponding device. Likewise, it is appreciated that implementations of devices detailed herein are understood as capable of being implemented as a corresponding method. It is thus understood that a device corresponding to a method detailed herein may include one or more components configured to perform each aspect of the related method.

All acronyms defined in the above description additionally hold in all claims included herein.

What is claimed is:

1. A wheel sensor arrangement, comprising:
a first wheel speed sensor comprising a first semiconductor die, the first wheel speed sensor configured to provide first data regarding a speed of a rotating wheel;
a second wheel speed sensor comprising a second semiconductor die, the second wheel speed sensor configured to provide second data regarding the speed of the rotating wheel, wherein the second semiconductor die is galvanically isolated from the first semiconductor die; and
a mold housing formed around the first wheel speed sensor and the second wheel speed sensor, the mold housing including a separation feature located between the first wheel speed sensor and the second wheel speed sensor,
wherein the separation feature separates the mold housing into a first region and a second region,
wherein the first wheel speed sensor is located in the first region and the second wheel speed sensor is located in the second region.

2. The wheel sensor arrangement of claim 1,
wherein the first semiconductor die comprises a first major surface opposing a second major surface and the second semiconductor die comprises a third major surface opposing a fourth major surface, and wherein the first major surface and the third major surface are each substantially parallel to each other, and
wherein from a front perspective facing the first major surface of the first semiconductor die, the first semiconductor die is positioned horizontally away from the second semiconductor.

3. The wheel sensor arrangement of claim 2,
wherein the first major surface of the first semiconductor die is coplanar with the third major surface of the second semiconductor die.

4. The wheel sensor arrangement of claim 2, wherein the first semiconductor die is rotated at a first angle in a plane coplanar with the first major surface of the first semiconductor die.

5. The wheel sensor arrangement of claim 4, wherein from a front perspective facing the first major surface of the first semiconductor die, the first semiconductor die is rotated so that an arc of a virtual circle centered outside of the wheel sensor arrangement intersects the first major surface of the first semiconductor die substantially along a major axis of the first major surface of the first semiconductor die, the virtual circle being coplanar with the first major surface of the first semiconductor die.

6. The wheel sensor arrangement of claim 5, wherein from a front perspective facing the first major surface of the first semiconductor die, the second semiconductor die is rotated so that the arc of the virtual circle centered outside of the wheel sensor arrangement intersects the third major surface of the second semiconductor die along a major axis of the third major surface of the second semiconductor die.

7. The wheel sensor arrangement of claim 6, wherein boundaries of the second semiconductor die appear as a mirror image to boundaries of the first semiconductor die and wherein a distance from a midpoint of the first major surface of the first semiconductor die to a center of the virtual circle is equal to a distance from a midpoint of the third major surface of the second semiconductor die to the center of the virtual circle.

8. The wheel sensor arrangement of claim 1,
wherein the first wheel speed sensor comprises a first lead frame on which the first semiconductor die is mounted, and the second wheel speed sensor comprises a second lead frame on which the second semiconductor die is mounted.

9. The wheel sensor arrangement of claim 1, further comprising:

a first set of pins electrically connected to the first wheel speed sensor, the first set of pins extending from the first wheel speed sensor inside the mold housing to outside of the mold housing;

a second set of pins electrically connected to the second wheel speed sensor, the second set of pins extending from the second wheel speed sensor inside the mold housing to outside of the mold housing; and a dummy pin between the first set of pins and the second set of pins so as to provide a mechanical barrier and a galvanic insulation between the first set of pins and the second set of pins.

10. The wheel sensor arrangement of claim 9, wherein the dummy pin is electrically conductive or electrically insulating.

11. The wheel sensor arrangement of claim 9, wherein the dummy pin extends inside the mold housing at least to a sidewall of the mold housing and parallel to at least one of the first set of pins or the second set of pins.

12. The wheel sensor arrangement of claim 11, wherein the dummy pin extends from inside the mold housing to outside of the mold housing.

13. The wheel sensor arrangement of claim 12, wherein the dummy pin extends from inside the mold housing to outside of the mold housing to a distal end of one of at least one of the first set of pins or the second set of pins.

14. The wheel sensor arrangement of claim 9, further comprising:

an anchor structure arranged inside the mold housing mechanically coupled to the dummy pin, the anchor structure being electrically insulating and located horizontally between the first semiconductor die and the second semiconductor die.

15. The wheel sensor arrangement of claim 1, wherein the separation feature comprises a crack stop structure.

16. The wheel sensor arrangement of claim 1, wherein the separation feature comprises a weakened area of the mold housing between the first semiconductor die and the second semiconductor die.

17. The wheel sensor arrangement of claim 1, wherein the separation feature is located between a pair of opposed recessed indentations of the mold housing.

18. The wheel sensor arrangement of claim 17, wherein the pair of opposed recessed indentations extend along a periphery of the mold housing.

19. The wheel sensor arrangement of claim 1, wherein the separation feature provides a mechanical barrier in the mold housing that prevents mechanical damage that emerges in the wheel sensor arrangement from spreading from the first region to the second region.

20. A wheel sensor system, comprising:

a wheel sensor arrangement comprising:

a first wheel speed sensor comprising a first semiconductor die, the first wheel speed sensor configured to provide first data regarding a speed of a rotating wheel;

a second wheel speed sensor comprising a second semiconductor die, the second wheel speed sensor configured to provide second data regarding the speed of the rotating wheel, wherein the second semiconductor die is galvanically isolated from the first semiconductor die; and a mold housing formed around the first wheel speed sensor and the second wheel speed sensor, the mold housing including a separation feature located between the first wheel speed sensor and the second wheel speed sensor, wherein the separation feature separates the mold housing into a first region and a second region, wherein the first wheel speed sensor is located in the first region and the second wheel speed sensor is located in the second region;

a wheel comprising a pole wheel; and a sensor encoder mounted on the pole wheel and configured to actuate wheel speed sensor data in the first wheel speed sensor and in the second wheel speed sensor.

\* \* \* \* \*